United States Patent [19]
Manning

[11] Patent Number: 6,029,252
[45] Date of Patent: Feb. 22, 2000

[54] METHOD AND APPARATUS FOR GENERATING MULTI-PHASE CLOCK SIGNALS, AND CIRCUITRY, MEMORY DEVICES, AND COMPUTER SYSTEMS USING SAME

[75] Inventor: Troy A. Manning, Meridian, Id.

[73] Assignee: Micron Technology, Inc., Boise, Id.

[21] Appl. No.: 09/061,859

[22] Filed: Apr. 17, 1998

[51] Int. Cl.[7] .................................................. G06F 1/06
[52] U.S. Cl. ............................................................ 713/556
[58] Field of Search .................................... 713/500, 556; 711/167

[56] References Cited

U.S. PATENT DOCUMENTS

| | | | |
|---|---|---|---|
| 5,173,618 | 12/1992 | Eisenstadt | 327/239 |
| 5,212,716 | 5/1993 | Ferraiolo et al. | 375/373 |
| 5,396,111 | 3/1995 | Frangioso et al. | 327/144 |
| 5,497,263 | 3/1996 | Masuda et al. | 327/278 |
| 5,699,005 | 12/1997 | Menkhoff et al. | 327/292 |
| 5,929,682 | 7/1999 | Kazuya et al. | 327/291 |

OTHER PUBLICATIONS

Descriptive literature entitled, "400 MHz SLDRAM, 4M×16 SLDRAM Pipelined, Eight Bank, 2.5 V Operation," pp. 1–22.

"Draft Standard for a High–Speed Memory Interface (SyncLink)," Microprocessor and Microcomputer Standards Subcommittee of the IEEE Computer Society, Copyright 1996 by the Institute of Electrical and Electronics Engineers, Inc., New York, NY, pp. 1–56.

*Primary Examiner*—Thomas M. Heckler
*Attorney, Agent, or Firm*—Dorsey & Whitney LLP

[57] ABSTRACT

A multi-phase clock generator is implemented by a delay circuit that receives an input clock signal. The clock generator couples the input clock signal to a first clock output terminal and to a delay circuit. The delay circuit delays the input clock signal to produce a delayed clock signal, and the delayed clock signal is coupled to a second clock output terminal. The first and second clock signals coupled to the first and second clock output terminals are applied to a logic circuit that generates two clock signals and their compliments. These clock signals are used to clock a shift register on both the rising and falling edge of the input clock signal. The shift register may be used in a command buffer for a packetized DRAM, and one or more of the resulting packetized DRAMs may be used in a computer system.

33 Claims, 10 Drawing Sheets

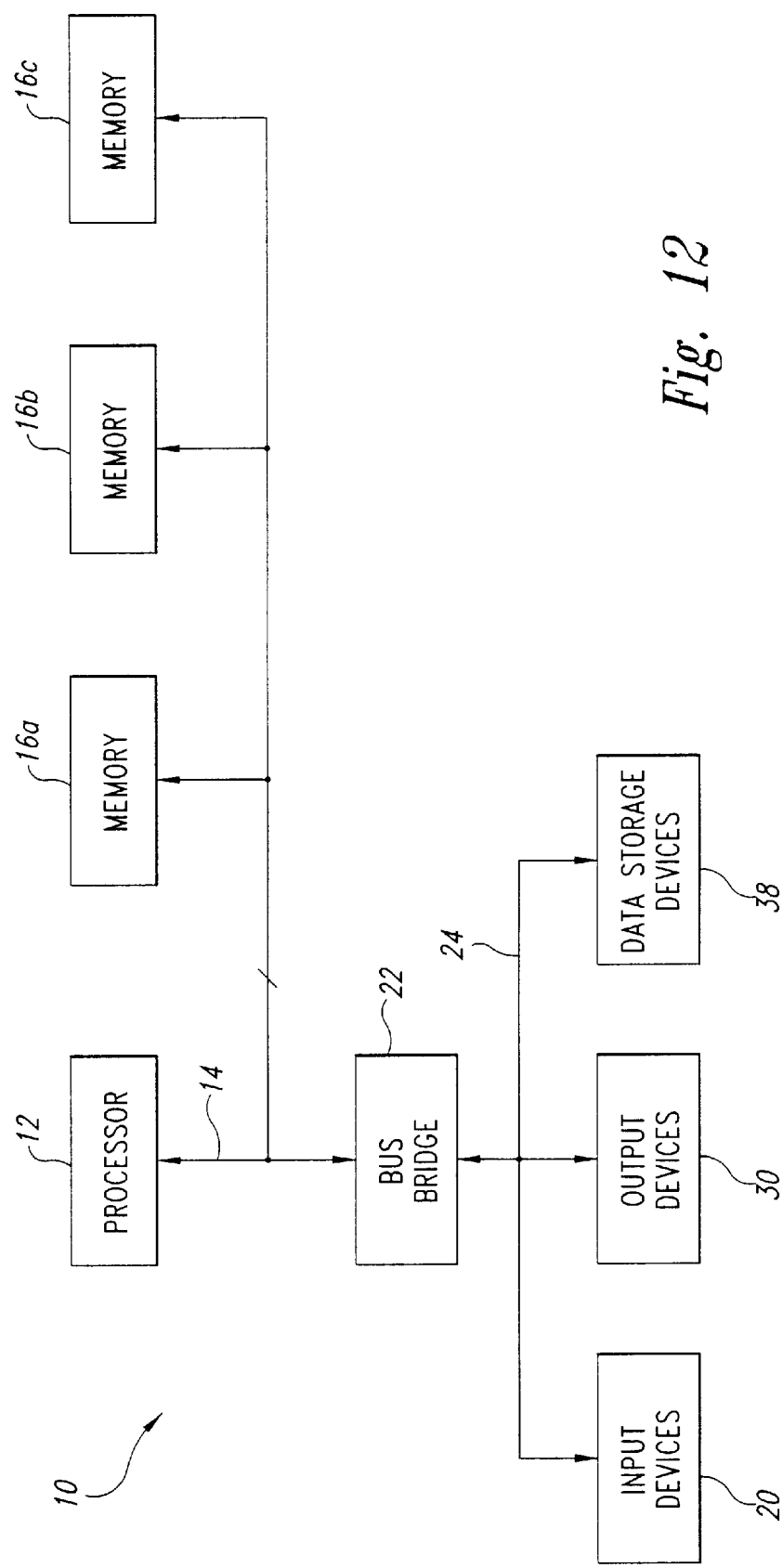

METHOD AND APPARATUS FOR GENERATING MULTI-PHASE CLOCK SIGNALS, AND CIRCUITRY, MEMORY DEVICES, AND COMPUTER SYSTEMS USING SAME

TECHNICAL FIELD

This invention relates to a method and apparatus for generating clock signals having different phases, to circuitry using the clock generating method and apparatus, such as shift register circuits, and to memory devices and computer systems containing the circuitry using the clock generating method and apparatus.

BACKGROUND OF THE INVENTION

Conventional computer systems include a processor (not shown) coupled to a variety of memory devices, including read-only memories ("ROMs") which traditionally store instructions for the processor, and a system memory to which the processor may write data and from which the processor may read data. The processor may also communicate with an external cache memory, which is generally a static random access memory ("SRAM"). The processor also communicates with input devices, output devices, and data storage devices.

Processors generally operate at a relatively high speed. Processors such as the Pentium® and Pentium Pro® microprocessors are currently available that operate at clock speeds of at least 200 MHz. However, the remaining components of the computer system, with the exception of SRAM cache, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, and the input devices, output devices, and data storage devices are coupled to the processor bus through a bus bridge. The memory controller allows the system memory devices to operate at a lower clock frequency that is substantially lower than the clock frequency of the processor. Similarly, the bus bridge allows the input devices, output devices, and data storage devices to operate at a substantially lower frequency. Currently, for example, a processor having a 200 MHz clock frequency may be mounted on a mother board having a 66 MHz clock frequency for controlling the system memory devices and other components.

Access to system memory is a frequent operation for the processor. The time required for the processor, operating, for example, at 200 MHz, to read data from or write data to a system memory device operating at, for example, 66 MHz, greatly slows the rate at which the processor is able to accomplish its operations. Thus, much effort has been devoted to increasing the operating speed of system memory devices.

System memory devices are generally dynamic random access memories ("DRAMs"). Initially, DRAMs were asynchronous and thus did not operate at even the clock speed of the motherboard. In fact, access to asynchronous DRAMs often required that wait states be generated to halt the processor until the DRAM had completed a memory transfer. However, the operating speed of asynchronous DRAMs was successfully increased through such innovations as burst and page mode DRAMs which did not require that an address be provided to the DRAM for each memory access. More recently, synchronous dynamic random access memories ("SDRAMs") have been developed to allow the pipelined transfer of data at the clock speed of the motherboard. However, even SDRAMs are incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a computer architecture known as "SyncLink." In the SyncLink architecture, the system memory is coupled to the processor either directly through the processor bus or through a memory controller (not shown). Rather than requiring that separate address and control signals be provided to the system memory, SyncLink memory devices receive command packets that include both control and address information. The SyncLink memory device then outputs or receives data on a data bus that may be coupled directly to the data bus portion of the processor bus.

An example of a SyncLink memory device 16 is shown in block diagram form in FIG. 1. The memory device 16 includes a clock divider and delay circuit 40 that receives a master clock signal 42 and generates a large number of other clock and timing signals to control the timing of various operations in the memory device 16. The memory device 16 also includes a command buffer 46 and an address capture circuit 48 which receive an internal clock CLK signal, a command packet CA0–CA9 on a command bus 50, and a FLAG signal on line 52. The command packet CA0–CA9 contains control and address information for each memory transfer, and the FLAG signal identifies the start of a command packet which may include more than one 10-bit packet word. In fact, a command packet is generally in the form of a sequence of 10-bit packet words on the 10-bit command bus 50. The command buffer 46 receives the command packet from the bus 50, and compares at least a portion of the command packet to identifying data from an ID register 56 to determine if the command packet is directed to the memory device 16 or some other memory device 16 in the event multiple memory devices 16 are used together in a system. If the command buffer determines that the command is directed to the memory device 16, it then provides a command word to a command decoder and sequencer 60. The command decoder and sequencer 60 generates a large number of internal control signals to control the operation of the memory device 16 during a memory transfer.

The address capture circuit 48 also receives the command words from the command bus 50 and outputs a 20-bit address corresponding to the address information in the command. The address is provided to an address sequencer 64 which generates a corresponding 3-bit bank address on bus 66, a 10-bit row address on bus 68, and a 7-bit column address on bus 70.

One of the problems of conventional DRAMs is their relatively low speed resulting from the time required to precharge and equilibrate circuitry in the DRAM array. The SyncLink memory device 16 shown in FIG. 1 largely avoids this problem by using a plurality of memory banks 80, in this case eight memory banks 80a–h. After a memory read from one bank 80a, the bank 80a can be precharged while the remaining banks 80b–h are being accessed. Each of the memory banks 80a–h receive a row address from a respective row latch/decoder/driver 82*a–h*. All of the row latch/ decoder/drivers 82*a–h* receive the same row address from a predecoder 84 which, in turn, receives a row address from either a row address register 86 or a refresh counter 88 as determined by a multiplexer 90. However, only one of the row latch/decoder/drivers 82*a–h* is active at any one time as determined by bank control logic 94 as a function of bank data from a bank address register 96.

The column address on bus 70 is applied to a column latch/decoder 100 which, in turn, supplies I/O gating signals to an I/O gating circuit 102. The I/O gating circuit 102 interfaces with columns of the memory banks 80*a–h* through sense amplifiers 104. Data is coupled to or from the memory banks 8*a–h* through the sense amps 104 and I/O gating circuit 102 to a data path subsystem 108 which includes a read data path 110 and a write data path 112. The read data path 110 includes a read latch 120 receiving and storing data from the I/O gating circuit 102. In the memory device 16 shown in FIG. 1, 64 bits of data are applied to and stored in the read latch 120. The read latch then provides four 16-bit data words to a multiplexer 122. The multiplexer 122 sequentially applies each of the 16-bit data words to a read FIFO buffer 124. Successive 16-bit data words are clocked through the FIFO buffer 124 by a clock signal generated from an internal clock by a programmable delay circuit 126. The FIFO buffer 124 sequentially applies the 16-bit words and two clock signals (a clock signal and a quadrature clock signal) to a driver circuit 128 which, in turn, applies the 16-bit data words to a data bus 130 forming part of the processor bus 14. The driver circuit 128 also applies the clock signals to a clock bus 132 so that a device such as the processor 12 reading the data on the data bus 130 can be synchronized with the data.

The write data path 112 includes a receiver buffer 140 coupled to the data bus 130. The receiver buffer 140 sequentially applies 16-bit words from the data bus 130 to four input registers 142, each of which is selectively enabled by a signal from a clock generator circuit 144. Thus, the input registers 142 sequentially store four 16-bit data words and combine them into one 64-bit data word applied to a write FIFO buffer 148. The write FIFO buffer 148 is clocked by a signal from the clock generator 144 and an internal write clock WCLK to sequentially apply 64-bit write data to a write latch and driver 150. The write latch and driver 150 applies the 64-bit write data to one of the memory banks 80*a–h* through the I/O gating circuit 102 and the sense amplifier 104.

As mentioned above, an important goal of the SyncLink memory device architecture is to allow data transfer between a processor and a memory device to occur at a significantly faster rate. Faster data transfer can be achieved by "pipelining" the transfer of data in synchronism with a clock signal. The rate of data transfer is then controlled by the frequency of the clock signal. Typically, a bit of data is clocked into or out of the memory device on each rising edge of the clock signal. However, faster data transfer can be achieved by clocking data into or out of the memory device on each transition of the clock signal, i.e. on both the rising and falling edges of the clock signal. As explained in detail below, clocking data on both edges of the clock, known as "double data rate" clocking, is generally achieved by driving various circuits with both a first clock signal, CLK, and a quadrature clock signal, CLK90, that is delayed by 90 degrees from the first clock signal. However, at higher clock speeds needed to achieve higher data transfer rates, it can be difficult to obtain these quadrature clock signals CLK and CLK90. Moreover, generating quadrature clock signals typically requires a substantial amount of circuitry, thus consuming a significant area of a semiconductor chip.

The traditional approach to obtaining quadrature clock signals is to use a clock generator 154 of the type shown in FIG. 2. The clock generator 154 includes a first J-K flip flop 156 that generates the CLK signal and a second J-K flip-flop 158 that generates the CLK90 signal. As shown in the timing diagram of FIG. 3, a clock signal CLKA having twice the frequency of the quadrature clock signals CLK and CLK90 is applied to the clock input of the first flip-flop 156. The J and K inputs of the first flip-flop 156 are coupled to a logic "1" voltage level so that the first flip-flop 156 toggles, as also shown in FIG. 3. Thus, the CLK signal generated at the Q output of the flip-flop 156 transitions on each rising edge of the CLKA signal.

The second J-K flip-flop 158 is clocked by the inverse of the CLKA signal, which is generated at the output of an inverter 160 that receives the CLKA signal. The second flip-flop 158 is also configured to toggle since its J and K inputs are coupled to a logic "1" voltage level. Thus, as shown in FIG. 3, the CLK90 signal generated at the Q output of the flip-flop 158 transitions on each falling edge of the CLKA signal.

There are two primary disadvantages of the conventional approach shown in FIG. 2. First, each J-K flip-flop 156, 158 requires a great deal of circuitry to implement, thus increasing the size, complexity, and expense of memories and other devices using the J-K flip-flops 156, 158 to generate quadrature clock signals. Second, the use of a clock generator 154 of the type shown in FIG. 2 requires an input clock signal having twice the frequency of the quadrature clock signals CLK and CLK90 to toggle the flip flops 156, 158. However, as the speed of memories and other devices requiring quadrature clock signals increase, it is increasingly difficult to couple a clock signal having such an extremely high frequency to a clock generator.

Although the foregoing discussion is directed to the need for improved clock generators used in command buffers of packetized DRAMs. similar problems exist in other memory devices, such as synchronous DRAMs, which must process control and other signals at a high rate of speed, as well as in other devices in which the operation of the device is synchronized to quadrature clock signals. Therefore, there is a need for a multi-phase clock generator that is relatively simple and yet does not require an input clock signal having twice the frequency of the clock signals provided by the clock generator.

SUMMARY OF THE INVENTION

The present invention is directed to a method and apparatus for generating multi-phase clock signals that may be used in the command generator of memory devices. The multi-phase clock generator produces on first and second output terminals respective first and second clock signals in which the second clock signal is delayed relative to the first clock signal. A coupling circuit couples an input clock signal applied to an input terminal to the first output terminal of the clock generator. The input clock signal is also coupled to the input of a delay circuit having an output coupled to the second output terminal of the clock generator. The delay circuit delays the input clock signal by a phase shift corresponding to more than 0 degrees and less than 180 degrees of the input clock signal. The first and second clock signals generated by the multi-phase clock generator may be used in a clock circuit having a first gate, such as a NAND gate, operating according to an AND function, and a second gate, such as a NOR gate, operating according to an OR function. The first and second gates each receive the first and second clock signals from the multi-phase clock generator to provide a pair of clocking signals. The clocking signals may drive a shift register so that data is shifted through the shift register on both the leading and falling edges of the input clock signal. The shift register may be used in a packetized DRAM to sequentially store a plurality of command words. One or more of the resulting DRAMs may then be used in a computer system.

BRIEF DESCRIPTION OF THE DRAWINGS

FIG. 12 is a block diagram of a computer system including a SyncLink memory device of the type shown in FIG. 1 and using the multiphase clock generator of FIG. 10 in its command buffer.

DETAILED DESCRIPTION OF THE INVENTION

Figure 1:
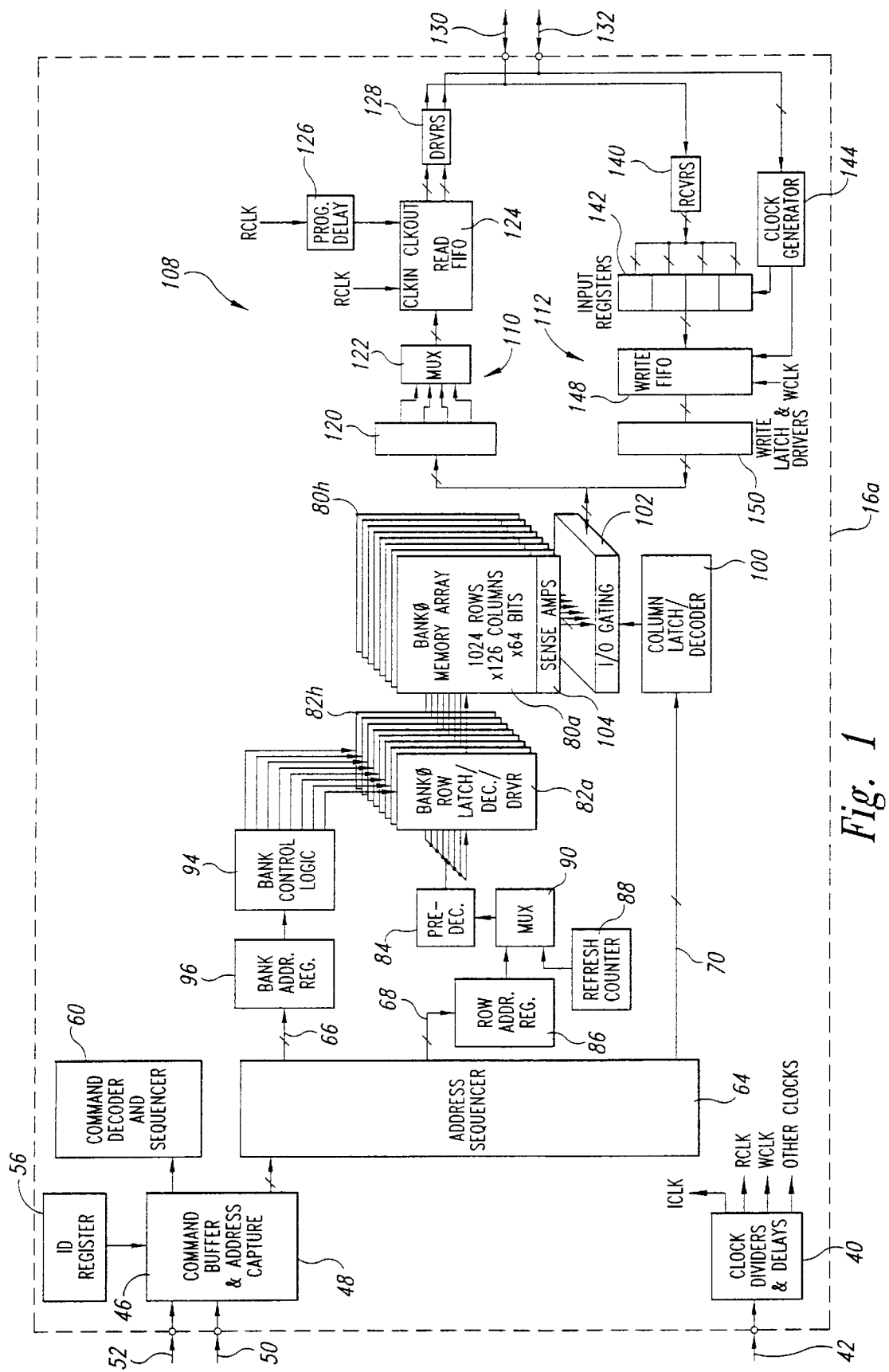
FIG. 1 is a block diagram of a SyncLink packetized dynamic random access memory (DRAM") that may advantageously use embodiments of the inventive clock generating circuit and method.
Figure 2:
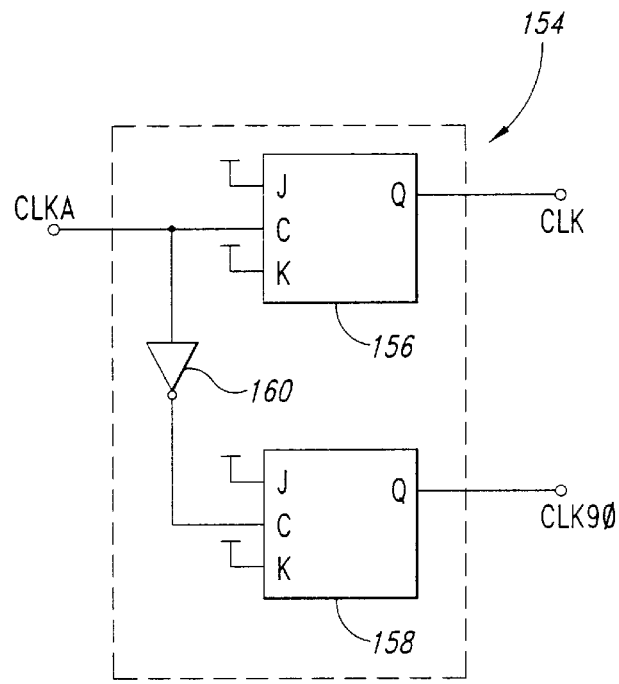
FIG. 2 is a logic diagram of a prior art circuit for generating quadrature clock signals that may be used in the memory of FIG. 1.
Figure 3:
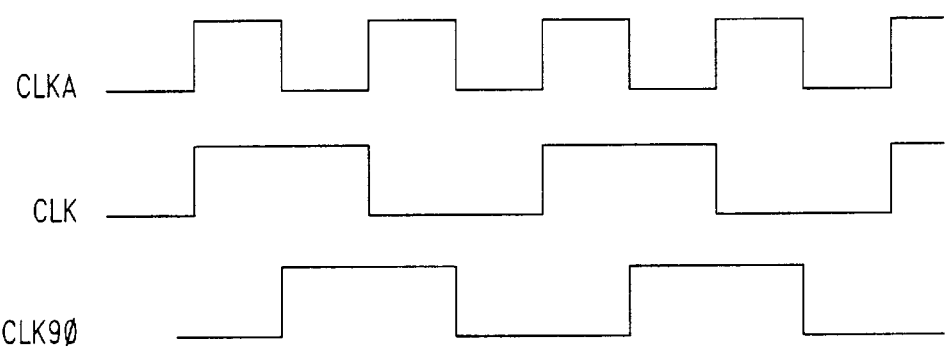
FIG. 3 is a timing diagram showing various signals present in the quadrature clock generating circuit of FIG. 2.
Figure 4:
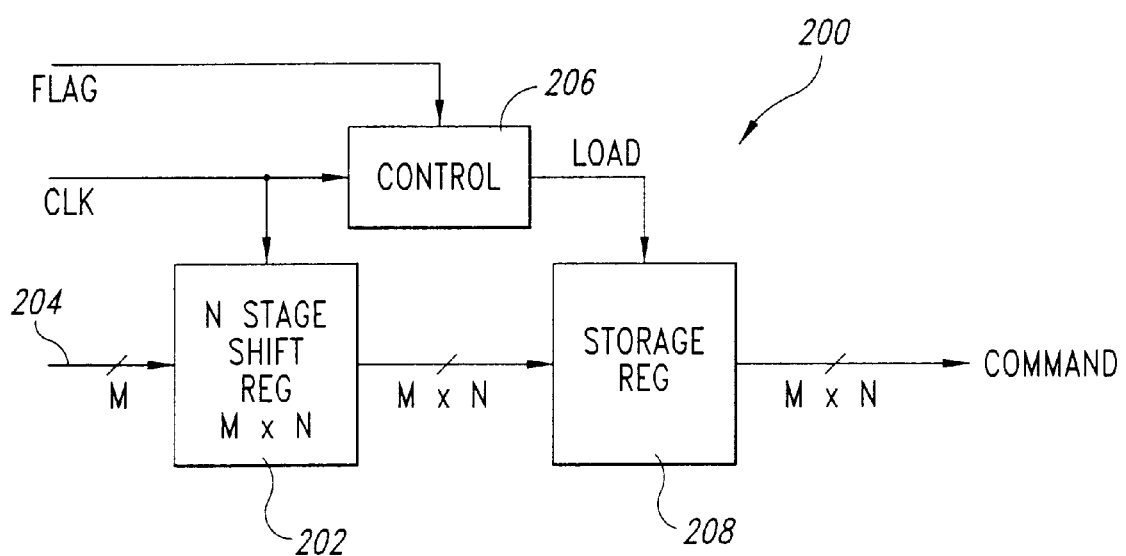
FIG. 4 is a block diagram of a command buffer that is usable in the packetized DRAM of FIG. 1.

One embodiment of a command buffer 46 that may use either the prior art quadrature clock generator clock generating circuit 154 of FIG. 2 or a multi-phase clock generating circuit in accordance with the invention is illustrated in FIG. 4. A command packet consisting of a plurality of packet words are applied to a shift register 202 via a bus 204. The width of the bus 204 corresponds to the size of the shift register 202, and the number of packet words in the command packet corresponds to the number of stages of the shift register 202. In the embodiment shown in FIG. 4. the shift register 202 has four stages each of which is 10 bits wide. Thus, the shift register 202 sequentially receives four 10-bit packet words responsive to a clock signal CLK. Coincident with the start of a four word command packet, a FLAG signal is applied to a control circuit 206 which is clocked by the CLK signal along with the shift register 202. After four command words have been shifted into the shift register 202, the control circuit 206 generates a LOAD signal that is applied to a storage register 208. The storage register 208 then loads all of the data stored in the shift register 202. In the embodiment shown in FIG. 4 in which four 10-bit packet words are shifted into the shift register 202, the storage register 208 receives and stores a 40-bit command word. However, in the more general case, the shift register 202 has N stages, each of which has a width of M bits, and the storage register 208 loads an M*N bit command word. After the storage register 208 has been loaded, it continuously outputs the M*N bit command word. The command word is used to control the operation of the memory 16 of FIG. 1. The manner in which the command buffer 46 performs this function is described in detail in U.S. patent application Ser. No. 08/994,461 to Manning, which is incorporated herein by reference.

Figure 5:
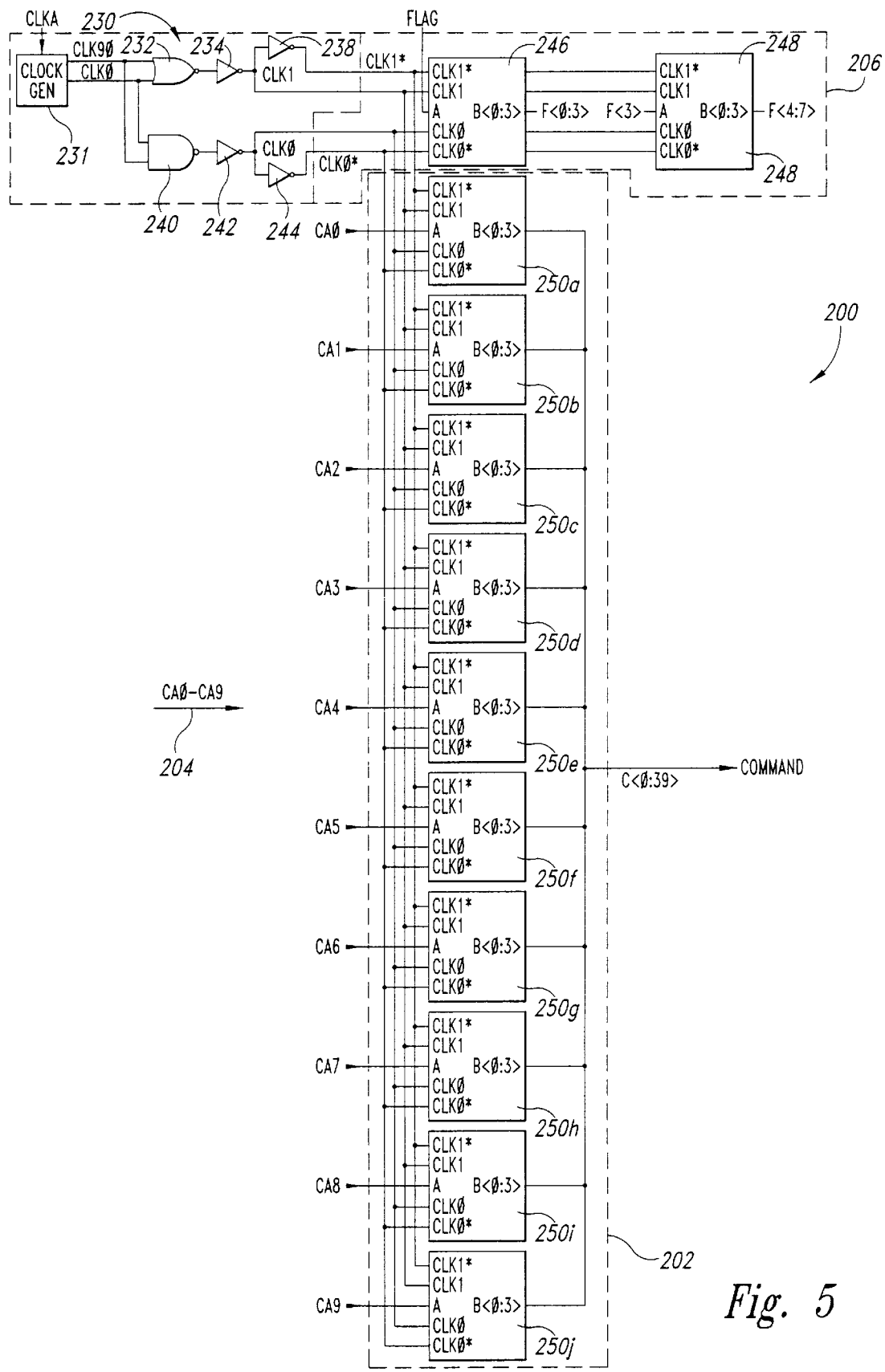
FIG. 5 is a more detailed block diagram of a command buffer that is usable in the packetized DRAM of FIG. 1.

The shift register 202 and the control circuit 206 are shown in greater detail in FIG. 5. The control circuit 206 generates a sequence of flag signals F<0:7> that are used to control the operation of the memory 16. One of these flag signals F<0:7> is used to load the contents of the shift register 202 into the storage register 208, as explained above. The control circuit 206 also includes a clock circuit 230 that causes the packet words to be shifted through the shift register 202. As explained below, the clock circuit 230 uses a quadrature clock generator 231 to generate quadrature clock signals CLK and CLK 90 from the input clock signal CLKA. The quadrature clock generator 231 may be either the prior art quadrature clock generator clock generating circuit 154 of FIG. 2 or a multi-phase clock generator in accordance with the invention. The quadrature clock signals CLK and CLK90 generated by the quadrature clock generator 231 are then used to generate two separate clock signals, CLK0 and CLK1, as well as their compliments, CLK0* and CLK1*, respectively. In response to these clock signals, the shift register 202 shifts each packet word through the shift register 202 on both the rising edge and the falling edge of the input clock signal CLKA.

Figure 6:
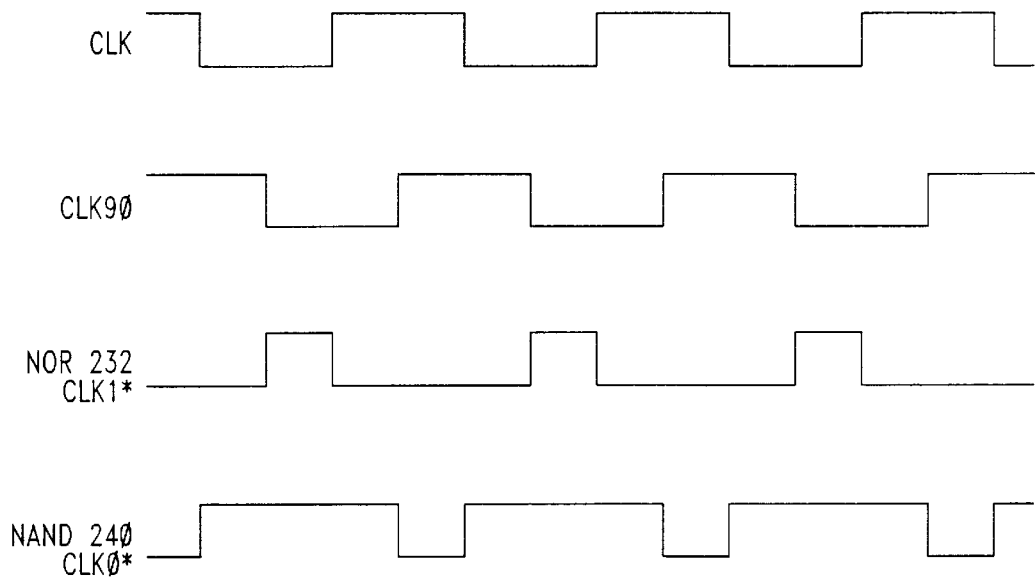
FIG. 6 is a timing diagram showing the clock signals used in a portion of the control circuit of the command buffer shown in FIGS. 4 and 5.

As shown in FIG. 5, The CLK and CLK90 signals are applied to a NOR gate 232 which outputs a high whenever CLK and CLK90 are both low, as illustrated in the timing diagram of FIG. 6. The output of the NOR gate 232 is applied through a first inverter 234 to generate a CLK1 signal. The NOR gate 232 and the inverter 234 generating the CLK1 signal thus implement an OR gate. The output of the inverter 234 is coupled through a second inverter 236 to generate a CLK1* signal (the "*" symbol after a signal name is used throughout to designate the compliment of the signal).

The CLK90 and CLK signals are also applied to a NAND gate 240 which outputs a low whenever both CLK and CLK90 are high, as also illustrated in FIG. 6. The output of the NAND gate 240 is coupled through an inverter 242 to generate a CLK0 signal. The NAND gate 240 and the inverter 242 generating the CLK0 signal thus implement an AND gate. The output of the inverter 240 is coupled through a second inverter 244 to generate a CLK0* signal.

The control circuit 206 also includes a pair of shift registers 246, 248 that are connected in series with each other to form an 8-stage shift register. The shift register 246 receives the FLAG signal and sequentially shifts it through the four stages of the shift register circuit 246 and then through the four stages of the shift register circuit 248 responsive to the CLK0, CLK0*, CLK1, and CLK1* signals. The FLAG signal is shifted through two stages of the shift register circuits 246, 248 each cycle of the CLK signals.

Thus, when FLAG goes high, two successive F<0:7> outputs of the shift register circuits 246, 248 sequentially go high each clock cycle.

The shift register 202 shown in FIG. 4 includes ten separate shift register circuits 250a–j, each of which receive a respective bit CA0–CA9 of the incoming 10-bit packet word. As explained further below, each of the shift register circuits 250a–j includes four shift register stages. Thus, after four clock cycles, four packet word bits CA have been shifted into each shift register circuit 250, and all four of these bits are available as a 4-bit word B<0:3>. Thus, the ten shift register circuits 250a–j collectively output a 40-bit command word.

Figure 7:
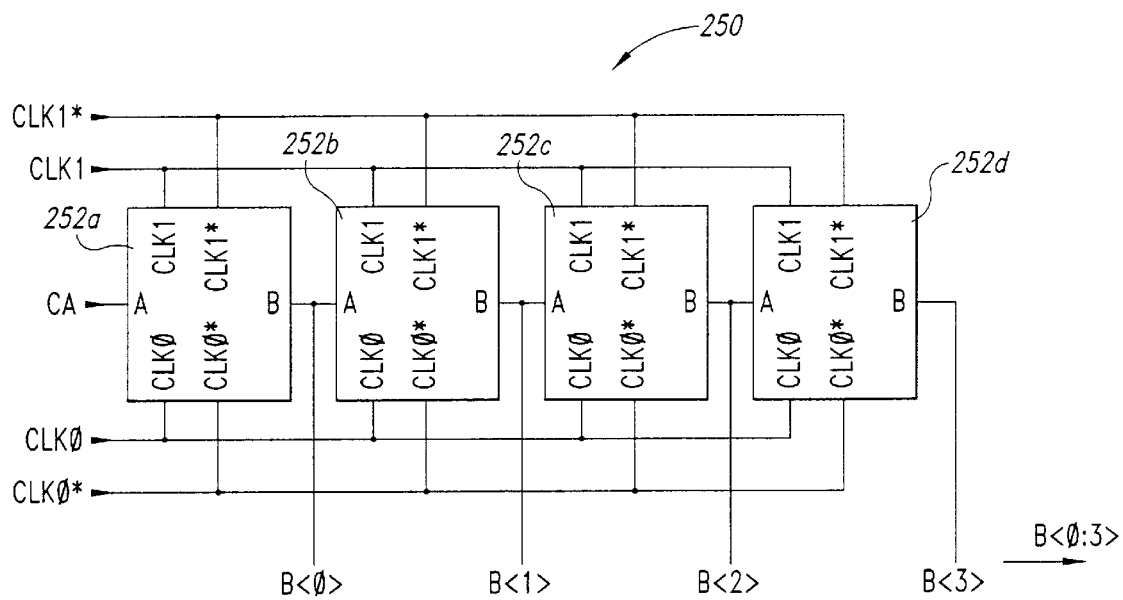
FIG. 7 is a logic diagram of one of the shift register circuits used in the command buffer shown in FIGS. 4 and 5.

As shown in FIG. 7, each of the shift registers 250a–j includes four shift register stages 252a–d. The first stage 252a receives the packet word bit CA, and its output is connected to the input of the second stage 252b and to an external output B<0>. Similarly, each stage 252, until the last 252d, is connected to the input of a subsequent stage and to an external output. Transfer from the input to the output of each stage 252 is in response to four clock signals CLK0, CLK0*, CLK1, CLK1* as explained in greater detail below. After two clock cycles, four packet word bits CA have been shifted into the shift register circuit 250 and all four of these bits are available as a 4-bit word B<0:3>. Thus, the ten shift register circuits 250a–j collectively output a 40-bit command word.

Figure 8:
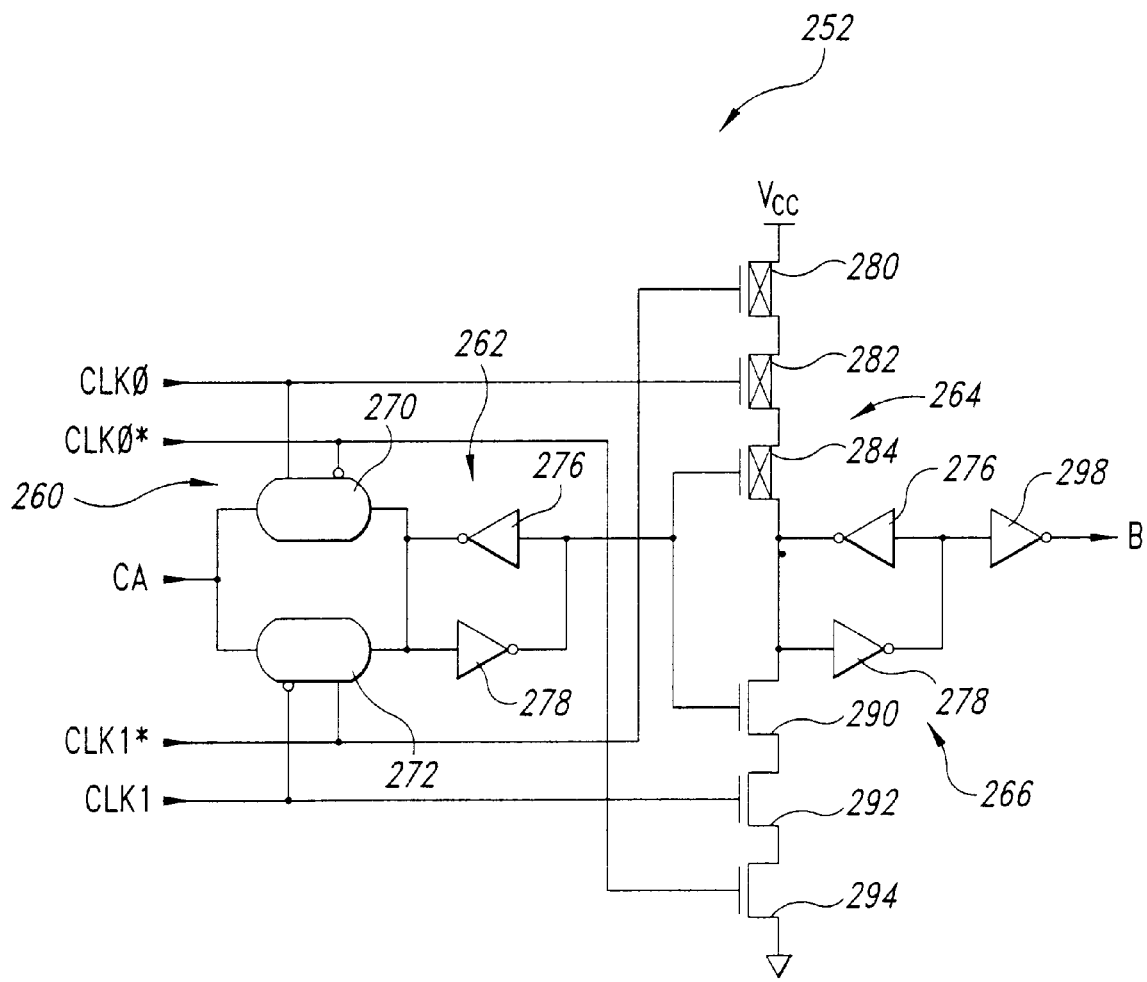
FIG. 8 is a schematic and logic diagram of a shift register stage used in the shift register circuit of FIG. 7.

The shift register stages 252 are shown in greater detail in FIG. 8. Each of the shift register stages 252 includes a first transfer gate 260, a second transfer gate 264, and a second latch 266. The transfer gate 260 includes a first transfer gate circuit 270 operated by the CLK0 and CLK0* signals and a second transfer circuit 272 in parallel with the first transfer circuit 270 and operated by the CLK1 and CLK1* signals. The first latch 262 and the second latch 266 are each formed by a pair of inverters 276, 278 connected input-to-output. The second transfer gate 264 is formed by three PMOS transistors 280, 282, 284 connected between a supply voltage and the input to the second latch 266. The second transfer gate 264 also includes three NMOS transistors 290, 292, 294 connected in series between the input to the second latch 266 and ground. As explained below, the second transfer gate 264 inverts the signal from the first latch 262. Therefore, to restore the correct phasing of the command signals CA, an inverter 298 is provided at the output of the second latch 266.

Each of the transfer gate circuits 270, 272 are formed by an NMOS transistor and a PMOS transistor (not shown) connected in parallel with each other with the gate of the NMOS transistor being coupled to the non-inverting input and the gate of the PMOS transistor coupled to the inverting input.

Figure 9:
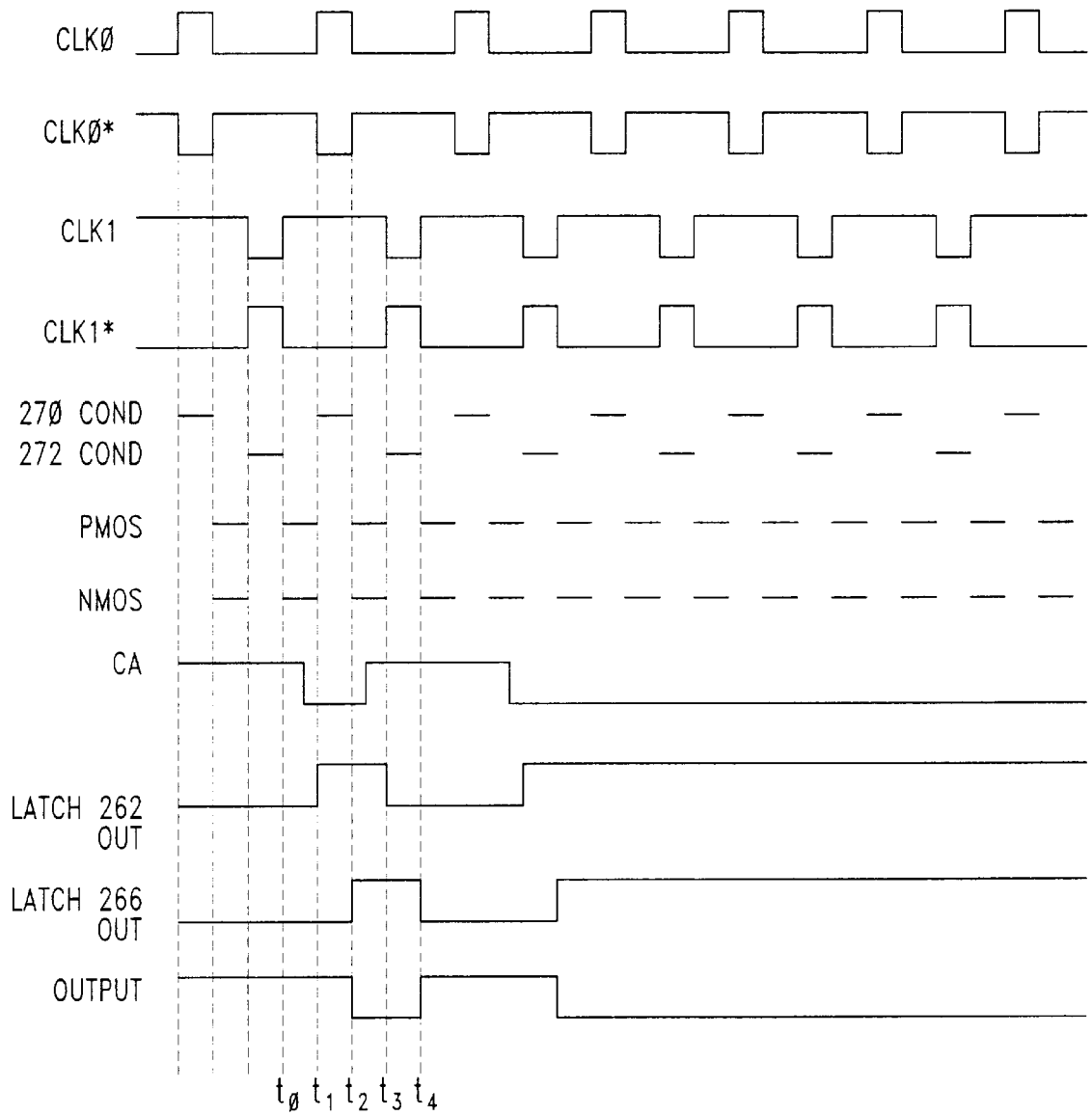
FIG. 9 is a timing diagram showing the various signals present in the shift register stage of FIG. 8.

The operation of the shift register stage 252 shown in FIG. 8 is best explained with reference to the timing diagram of FIG. 9. The transfer gate circuit 270 is conductive whenever the CLK0 signal is high and the CLK0* signal is low. Thus, the transfer gate circuit 270 is conductive for a short period each clock cycle, as shown by the line segments adjacent the 270 COND designation in FIG. 9. Similarly, the transfer gate 272 is conductive whenever the CLK1 signal is low and the CLK1* signal is high. As shown by the line segments in FIG. 8, the transfer gate circuit 272 is conductive for a short period each clock cycle, with the conductive period of the transfer gate circuit 270 being equally spaced from the conductive period of the transfer gate circuit 272. Thus, the first transfer gate 260 is conductive twice each clock cycle, with each conductive period followed by a period of non-conductivity. Each time the transfer gate 260 is conductive, the inverse of the command bit CA is output from the latch 262 to the second transfer gate 264.

The function of the second transfer gate 264 is to couple the input to the second latch 266 to either $V_{CC}$ or ground at the proper time depending upon the value at the output of the first latch 262. The PMOS transistors 280, 282 are conductive whenever CLK0 and CLK1* are both low, which occurs at times designated by the line segments adjacent the "PMOS" designation in FIG. 9. The NMOS transistors 292, 294 are both conductive whenever the CLK1 signal and the CLK0* signal are both high, which occurs twice each clock cycle at the times designated by the line segments adjacent "NMOS" in FIG. 9. Thus, the PMOS transistors 280, 282 and the NMOS transistors 292, 294 are all conductive at the same times, and these periods of conductivity alternate with the periods of conductivity of the first transfer gate 260. The input to the second latch 260 is coupled to either $V_{CC}$ or ground during these periods of conductivity depending upon whether the output of the first latch 262 turns ON the PMOS transistor 284 or the NMOS transistor 290. More specifically, if the output of the first latch 262 is high, the NMOS transistor 290 will turn ON, thereby applying a low to the input of the second latch 266. If the output of the first latch 262 is low, the PMOS transistor 284 will turn ON, thereby applying a high to the input of the second latch 266. Thus, the second transfer gate 264 couples the inverted output of the first latch 262 to the input of the second latch 266.

During the time that the second transfer gate 264 is conductive the second latch 266 outputs a signal that is the same as the output of the first latch 262 which, after passing through the inverter 298, is the same phase as the incoming command bit CA. The operation of the latch circuit 250 is shown using a command bit CA, which is initially high, but goes low shortly after $t_0$. During the next conductive period of the first transfer gate 260 at time $t_1$, the high command bit CA is transferred to the output of the first latch 262 in inverted form as shown in FIG. 9. During the next conductive period of the second transfer gate 264, the high at the output of the latch 262 is coupled to the output of the latch 266, thereby causing the output to go low at time $t_2$. Shortly thereafter, the command bit CA goes high. At the next conductive period of the first latch 260 at time $t_3$, this high is coupled through the first latch 260, thereby causing the output of the second latch 262 to go low. On the next conductive period of the second transfer gate 264 at time $t_4$, the high output of the first latch 262 is coupled to the output of the second latch 266, thereby causing the output to go high. Thus, a command bit coupled to the shift register stage 250 is shifted to the output of the shift register stage 250 less than one clock cycle later. On the next half clock cycle, the command bit is shifted to the output of the next shift register stage until four clock cycles have elapsed, at which time four command bits have been shifted into each shift register circuit 250. Thus, two command bits are shifted through each shift register circuit 250 each clock cycle in the same manner that the FLAG signal is shifted through two stages of the shift register circuit 246, 248 (FIG. 4) each clock cycle.

The shift register circuits 250 shown in FIG. 7, including the shift register stages shown in FIG. 8, are also used as the shift registers 246, 248 in the control circuit 206 (FIG. 5).

Figure 10:
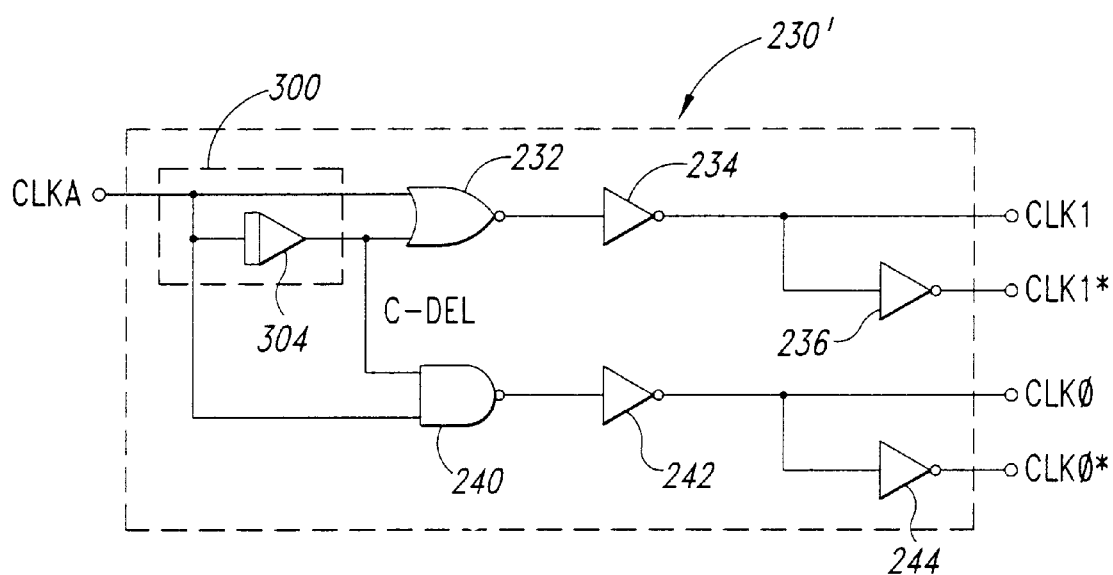
FIG. 10 is a is a logic diagram of one embodiment of a circuit for generating multi-phase clock signals that may be used in the memory of FIG. 1.

One embodiment of a multi-phase clock generator 300 in accordance with the invention that may be used in the clock circuit 230 of FIG. 5 as the quadrature clock generator 231 is shown in FIG. 10. The clock generator 300 is implemented by a conventional delay circuit 304 that receives the input clock signal CLKA and generates a delayed clock signal C-DEL. As best shown in the timing diagram of FIG. 11, the delay circuit 304 delays the input clock signal CLKA by substantially less than one-quarter of the period i.e., 90 degrees, of the input clock signal CLKA. However, as explained below, the clock generator 300 is able to function in the clock circuit 230' even though the phase shift produced by the delay circuit 304 differs somewhat from 90 degrees.

Figure 11:
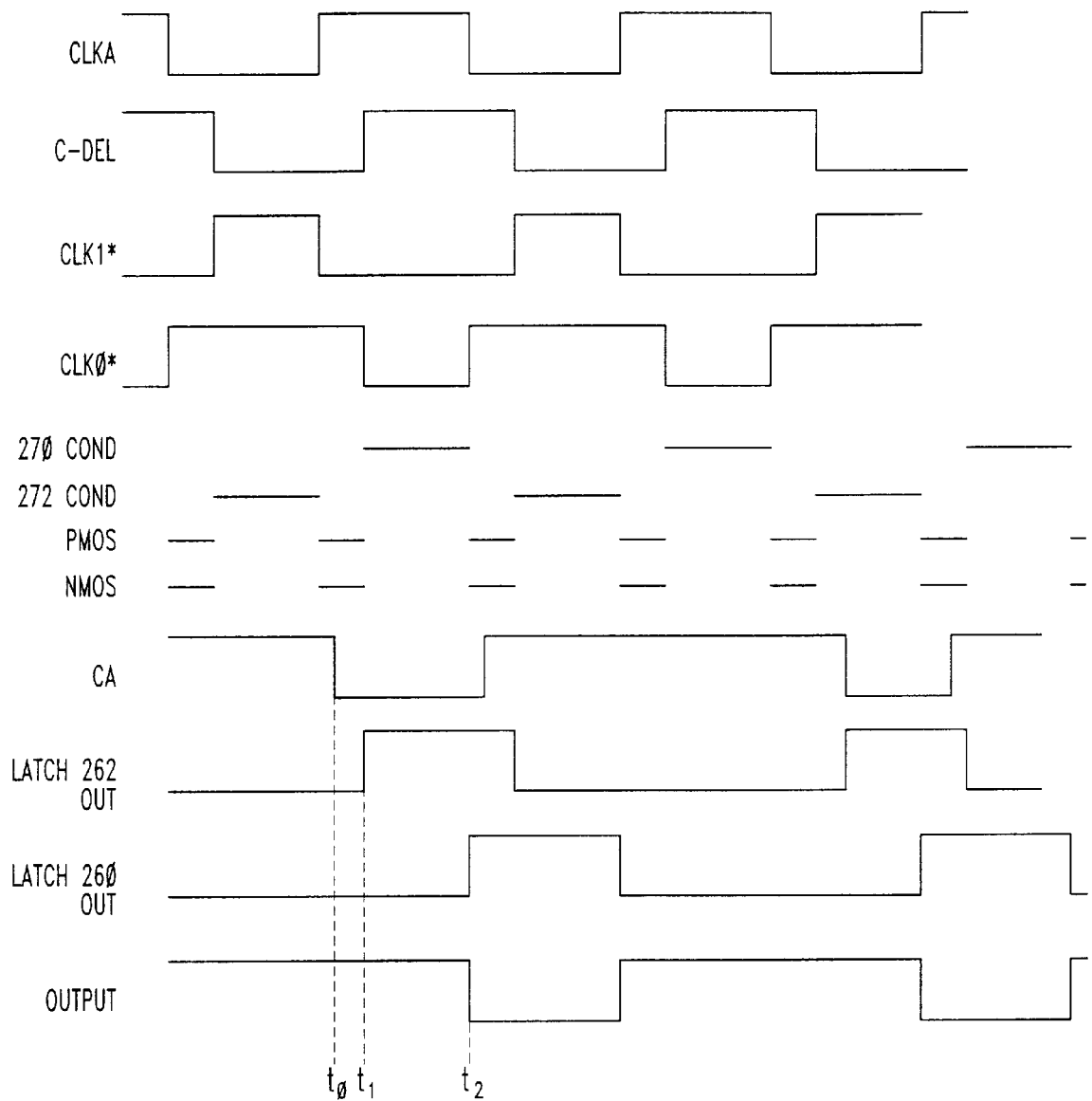
FIG. 11 is a timing diagram showing various signals present in the multi-phase clock generating circuit of FIG. 10.

As shown in FIG. 11, the clock circuit 230' processes the CLKA and C-DEL signals in the same manner that the CLK and CLK90 signals are processed by the clock circuit 230, as explained above with reference to FIG. 5. Specifically, the CLK1* signal generated at the output of the inverter 234 is high whenever the CLKA and C-DEL signals are both low. As further shown in FIG. 11, the CLK0* signal is low whenever the CLKA and C-DEL signals are both high. With reference, also, to FIG. 8, the pass gate 270 is therefor conductive whenever the CLKA and C-DEL signals are both high, and the pass gate 272 is conductive whenever the CLKA and C-DEL signals are both low. As further shown in FIG. 11, the PMOS transistors 280, 282 and the NMOS transistors 292, 294 are all conductive whenever neither the pass gate 270 NOR the pass gate 272 are conductive. As a result, the command word bit CA is applied to the latch 262 when the pass gates 270, 272 are conductive, and then stored in the latch 270 and coupled through the transfer gate 264 when the pass gates 270, 272 are non-conductive. The only effect of the signal C-DEL being phase shifted by less than 90 degrees is that the conductive period of the pass gates 270, 272 is increased and the conductive period of the transfer gate 264 is decreased. If the phase shift of the signal C-DEL is increased beyond 90 degrees, the conductive period of the pass gates 270, 272 is decreased and the conductive period of the transfer gate 264 is increased. However, the shift register stage 252 will function properly as long as the phase shift of the signal C-DEL does not decrease too closely to 0 degrees or increase too closely to 180 degrees.

With further reference to FIGS. 8 and 11, the command word bit CA transitions low at time $t_0$. At time $t_1$, the pass gate 270 becomes conductive and, at time $t_2$, the transfer gate 264 couples the output of the latch 262 to the B output of the shift register stage 252. Thus, despite the deviation of the C-DEL signal from a 90 degree phase shift relative to the input clock signal CLKA, the clock circuit 230' causes the shift register stage 252 to shift each command word bit CA through the shift register 202 (FIG. 5). Moreover, the clock generator 300 used in the clock circuit 230' is substantially less complex than the clock generator 154 of FIG. 2 that uses a pair of J-K flip-flops 156, 158 and an inverter 160.

As mentioned above, the command buffer 46 in the memory device 16 of FIG. 1 may use the multi-phase clock generator 300 of FIG. 10, and the resulting memory device may be used in a computer system as shown in FIG. 12. With reference to FIG. 12, the computer system 10 includes a processor 12 having a processor bus 14 coupled to three packetized dynamic random access memory or SyncLink DRAMs ("SLDRAM") devices 16a–c of the type explained above with reference to FIG. 1. The computer system 10 also includes one or more input devices 20, such as a keypad or a mouse, coupled to the processor 12 through a bus bridge 22 and an expansion bus 24, such as an industry standard architecture ("ISA") bus or a Peripheral component interconnect ("PCI") bus. The input devices 20 allow an operator or an electronic device to input data to the computer system 10. One or more output devices 30 are coupled to the processor 12 to display or otherwise output data generated by the processor 12. The output devices 30 are coupled to the processor 12 through the expansion bus 24, bus bridge 22 and processor bus 14. Examples of output devices 24 include printers and a video display units. One or more data storage devices 38 are coupled to the processor 12 through the processor bus 14, bus bridge 22, and expansion bus 24 to store data in or retrieve data from storage media (not shown). Examples of storage devices 38 and storage media include fixed disk drives floppy disk drives, tape cassettes and compact-disk read-only memory drives.

In operation, the processor 12 communicates with the memory devices 16a–c via the processor bus 14 by sending the memory devices 16a–c command packets that contain both control and address information. Data is coupled between the processor 12 and the memory devices 16a–c, through a data bus portion of the processor bus 14. Although all the memory devices 16a–c are coupled to the same conductors of the processor bus 14, only one memory device 16a–c at a time reads or writes data, thus avoiding bus contention on the processor bus 14. Bus contention is avoided by each of the memory devices 16a–c and the bus bridge 22 having a unique identifier, and the command packet contains an identifying code that selects only one of these components.

The computer system 10 also includes a number of other components and signal lines that have been omitted from FIG. 12 in the interests of brevity. For example, as explained below, the memory devices 16a–c also receive a master clock signal to provide internal timing signals, a data clock signal clocking data into and out of the memory device 16, and a FLAG signal signifying the start of a command packet.

While the invention has been described herein by way of exemplary embodiments, various modifications may be made without departing from the spirit and scope of the invention. Accordingly, the invention is not limited except as by the appended claims.

I claim:

1. A clock generator for producing on first and second output terminals respective first and second clock signals, the clock signals being produced responsive to an input clock signal received at an input terminal, the clock generator comprising:

a delay circuit having an input coupled to the input terminal, the delay circuit being operable to generate a delayed clock signal at an output, the delay circuit delaying the input clock signal applied to its input by a phase shift corresponding to more than 0 degrees and less than 180 degrees of the input clock signal;

a first gate operating according to an AND function, the first gate having a first input coupled to the input terminal and a second input coupled to the output of the delay circuit, the first gate having an output coupled to the first output terminal to apply the first clock signal to the first output terminal; and a second gate operating according to an OR function; the second gate having a first input coupled to the input terminal and a second input coupled to the output of the delay circuit, the second gate having an output coupled to the second output terminal to apply the second clock signal to the second output terminal.

2. The clock generator of claim 1 wherein the first gate comprises an AND gate.

3. The clock generator of claim 1 wherein the second gate comprises an OR gate.

4. The clock generator of claim 1 further comprising:
- a first inverter having an input coupled to the output of the first gate, the first inverter generating at an output the compliment of the first clock signal; and
- a second inverter having an input coupled to the output of the second gate, the second inverter generating at an output the compliment of the second clock signal.

5. A shift register circuit having a data input terminal to which a data signal is adapted to be applied and a clock input terminal to which an input clock signal is adapted to be applied, the shift register circuit comprising:
- a delay circuit having an input coupled to the clock input terminal, the delay circuit being operable to generate a delayed clock signal at an output, the delay circuit delaying the input clock signal applied to its input by a phase shift corresponding to more than 0 degrees and less than 180 degrees of the input clock signal;
- a first gate operating according to an AND function, the first gate having a first input coupled to the input terminal and a second input coupled to the output of the delay circuit, the first gate generating a first clock signal;
- a first inverter having an input coupled to the output of the first gate, the first inverter generating the compliment of the first clock signal;
- a second gate operating according to an OR function; the second gate having a first input coupled to the input terminal and a second input coupled to the output of the delay circuit, the second gate generating a second clock signal;
- a second inverter having an input coupled to the output of the second gate, the second inverter generating the compliment of the second clock signal;
- a latch having an input and an output;
- a first pass gate coupled between the data input terminal and the input of the latch, the first pass gate having complimentary control terminals coupled to the output of the first gate and the output of the first inverter, respectively;
- a second pass gate coupled between the data input terminal and the input of the latch, the second pass gate having complimentary control terminals coupled to the output of the second gate and the output of the second inverter, respectively; and
- a transfer gate coupled between the output of the latch and an output terminal of the shift register circuit, the transfer gate having first, second, third, and fourth control terminals coupled to the output of the second inverter, the output of the first gate, the output of the second gate, and the output of the first inverter, respectively, the transfer gate being operable to couple the output of the latch to the output terminal of the shift register circuit responsive to signals applied to the first and second control terminals having a first logic level and signals applied to the third and fourth control terminals having a second logic level that is different from the first logic level.

6. The shift register circuit of claim 5 wherein the first gate comprises an AND gate.

7. The shift register circuit of claim 5 wherein the second gate comprises an OR gate.

8. The shift register circuit of claim 5 wherein the transfer gate comprises:
- first, second, and third PMOS transistors coupled to each other source-to-drain between a supply voltage and an output terminal of the shift register circuit, each of the PMOS transistors having a respective gate, the gate of the first PMOS transistor comprising the first control terminal being coupled to the output of the second inverter, the gate of the second PMOS transistor comprising the second control terminal being coupled to the output of the first gate, and the gate of the third PMOS transistor being coupled to the output of the latch; and
- first, second, and third NMOS transistors coupled to each other drain-to-source between the output terminal of the shift register circuit and reference voltage, each of the NMOS transistors having a respective gate, the gate of the first NMOS transistor being coupled to the output of the latch, the gate of the second NMOS transistor comprising the third control terminal being coupled to the output of the second gate, and the gate of the third NMOS transistor comprising the fourth control terminal being coupled to the output of the first inverter.

9. The shift register circuit of claim 5 wherein the second gate comprises an OR gate.

10. A shift register circuit having a data input terminal to which a data signal may be applied and a clock input terminal to which an input clock signal may be applied, the shift register circuit comprising:
- a delay circuit having an input coupled to the clock input terminal the delay circuit being operable to generate a delayed clock signal at an output, the delay circuit delaying the input clock signal applied to its input by a phase shift corresponding to more than 0 degrees and less than 180 degrees of the input clock signal;
- a first gate operating according to an AND function, the first gate having a first input coupled to the input terminal and a second input coupled to the output of the delay circuit, the first gate generating a first clock signal; and
- a first inverter having an input coupled to the output of the first gate, the first inverter generating the compliment of the first clock signal;
- a second gate operating according to an OR function; the second gate having a first input coupled to the input terminal and a second input coupled to the output of the delay circuit, the second gate generating a second clock signal;
- a second inverter having an input coupled to the output of the second gate, the second inverter generating the compliment of the second clock signal;
- a latch having an input and an output;
- a first pass gate coupled between the data input terminal and the input of the latch, the first pass gate having complimentary control terminals coupled to receive the first clock signal from the first gate and the compliment of the first clock signal from the first inverter;
- a second pass gate coupled between the data input terminal and the input of the latch, the second pass gate having complimentary control terminals coupled to receive the second clock signal from the second gate and the compliment of the second clock signal from the second inverter; and
- first, second, and third PMOS transistors coupled to each other source-to-drain between a supply voltage and an output terminal of the shift register circuit, each of the PMOS transistors having a respective gate, the gate of the first PMOS transistor being coupled to receive the compliment of the second clock signal from the second inverter, the gate of the second PMOS transistor being coupled to receive the first clock signal from the first gate, and the gate of the third PMOS transistor being coupled to the output of the latch; and first, second, and third NMOS transistors coupled to each other drain-to-source between the output terminal of the shift register circuit and reference voltage, each of the NMOS transistors having a respective gate; the gate of the first NMOS transistor being coupled to the output of the latch, the gate of the second NMOS transistor being coupled to receive the second clock signal from the second gate, and the gate of the third NMOS transistor being coupled to receive the compliment of the first clock signal from the first inverter.

11. The shift register circuit of claim 10 wherein the first gate comprises an AND gate.

12. A command buffer for a memory device that may receive a command of N M-bit words on an M-bit bus, the command buffer comprising:

a delay circuit having an input coupled to a clock input terminal, the delay circuit being operable to generate a delayed clock signal at an output, the delay circuit delaying the input clock signal applied to its input by a phase shift corresponding to more than 0 degrees and less than 180 degrees of the input clock signal;

a first gate operating according to an AND function, the first gate having a first input coupled to the input terminal and a second input coupled to the output of the delay circuit, the first gate generating a first clock signal;

a first inverter having an input coupled to the output of the first gate, the first inverter generating the compliment of the first clock signal;

a second gate operating according to an OR function; the second gate having a first input coupled to the input terminal and a second input coupled to the output of the delay circuit, the second gate generating a second clock signal;

a second inverter having an input coupled to the output of the second gate, the second inverter generating the compliment of the second clock signal;

M shift registers each having an input terminal, an output terminal, and first, second, third, and fourth clock terminals coupled to the output of the first gate, the output of the first inverter, the output of the second gate, and the output of the second inverter, the input of each of the shift registers being coupled to a respective bit of the M-bit bus, each of the shift registers having N stages with a respective command bit applied to the input terminal being shifted from one stage to the next responsive to the clock signals applied to the clock terminals of the shift registers, each of the shift register stages comprising;

a first transfer gate having an input terminal that may receive one of the M-bits of the command, the first transfer gate further including first, second, third, and fourth control terminals coupled to the first, second, third, and fourth clock terminals, respectively, the first transfer gate being operable to transfer the command bit to an output terminal responsive to either the first clock signal applied to the first clock terminal having a first logic level and the second clock signal applied to the second clock terminal having a second logic level different from the first logic level, or the third clock signal applied to the third clock terminal having the second logic level and the fourth clock signal applied to the fourth clock terminal having the first logic level;

a storage device coupled to the output terminal of the first transfer gate, the storage device storing the command bit from the output terminal of the transfer gate and applying the stored command bit to an output terminal of the storage device; and a second transfer gate having an input terminal that may receive the stored command bit from the output terminal of the storage device, the second transfer gate further including first, second, third, and fourth control terminals coupled to the first, second, third, and fourth clock terminals, respectively, the second transfer gate being operable to transfer the command bit to an output terminal responsive to the second and third clock terminals receiving signals having the first logic level and the first and fourth clock terminals receiving signals having the second logic level;

a control circuit having a start terminal, a plurality of clock terminals, and an output terminal, the control circuit generating a load signal responsive to a predetermined number of clock signals applied to the clock terminals after a start signal has been applied to the start terminal; and a storage register having N*M storage cells each of which has an output terminal, an input terminal coupled to the output of a respective shift register stage, and a load terminal coupled to the output terminal of the control circuit, each of the storage cells storing a signal at the output terminal of the respective shift register stage responsive to the load signal applied to the load terminal of the storage cell, the N*M storage cells collectively outputting a command word.

13. The command buffer of claim 12 further comprising a second storage device coupled to the output terminal of the second transfer gate, the second storage device storing the command bit from the output terminal of the second transfer gate and applying the stored command bit to an output terminal of the second storage device.

14. The command buffer of claim 12 wherein the first gate comprises an AND gate.

15. The command buffer of claim 12 wherein the second gate comprises an OR gate.

16. The command buffer of claim 12 wherein the second transfer gate comprises first, second, third, fourth, fifth, and sixth switches connected in series with each other between first and second reference voltages, each of the switches having a control terminal, the control terminals of the third and fourth switches being coupled the output terminal of the first storage device to receive the stored command bit from the first storage device, the third switch closing responsive to a command bit of one value and the fourth switch closing responsive to a command bit of another value, a node between the second and third switches being coupled to the output terminal of the shift register stage, the control terminals of the first and second switches being coupled to the first and fourth clock terminals of the shift register and the control terminals of the fifth and sixth switches being coupled to the second and third clock terminals of the shift register, the first and second switches being operable to close to apply the first reference voltage to the third switch responsive to signals applied to the control terminals of the first and second switches having the second logic level, and the fifth and sixth switches being operable to close to apply the second reference voltage to the fourth switch responsive to signals applied to the control terminals of the fifth and sixth switches having the first logic level.

17. The command buffer of claim 16 wherein the first, second and third switches each comprises a PMOS transistor, and the fourth, fifth, and sixth switches each comprises an NMOS transistor.

18. The command buffer of claim 16 wherein the first voltage comprises a supply voltage and the second reference voltage comprises ground potential.

19. The command buffer of claim 18 wherein the first gate comprises an AND gate.

20. A memory device, comprising:

at least one array of memory cells storing data at a location determined by a row address and a column address responsive to a command word;

a row address circuit receiving and decoding the row address, and selecting a row of memory cells corresponding to the row address responsive to the command word;

a column address circuit receiving or applying data to one of the memory cells in the selected row corresponding to the column address responsive to the command word;

a data path circuit coupling data between an external terminal and the column address circuit responsive to the command word; and a command word generator generating the command word responsive to a command packet of N M-bit words received on an M-bit bus, the command word generator comprising:

a delay circuit having an input coupled to a clock input terminal, the delay circuit being operable to generate a delayed clock signal at an output, the delay circuit delaying the input clock signal applied to its input by a phase shift corresponding to more than 0 degrees and less than 180 degrees of the input clock signal;

a first gate operating according to an AND function, the first gate having a first input coupled to the input terminal and a second input coupled to the output of the delay circuit, the first gate generating a first clock signal;

a first inverter having an input coupled to the output of the first gate, the first inverter generating the compliment of the first clock signal;

a second gate operating according to an OR function; the second gate having a first input coupled to the input terminal and a second input coupled to the output of the delay circuit, the second gate generating a second clock signal to the second output terminal;

a second inverter having an input coupled to the output of the second gate, the second inverter generating the compliment of the second clock signal;

M shift registers each having an input terminal, an output terminal, and first, second, third, and fourth clock terminals coupled to the output of the first gate, the output of the first inverter, the output of the second gate, and the output of the second inverter, the input of each of the shift registers being coupled to a respective bit of the M-bit bus, each of the shift registers having N stages with a respective command bit applied to the input terminal being shifted from one stage to the next responsive to the clock signals applied to the clock terminals of the shift registers, each of the shift register stages comprising;

a first transfer gate having an input terminal that may receive one of the M-bits of the command, the first transfer gate further including first, second, third, and fourth control terminals coupled to the first, second, third, and fourth clock terminals, respectively, the first transfer gate being operable to transfer the command bit to an output terminal responsive to either the first clock signal applied to the first clock terminal having a first logic level and the second clock signal applied to the second clock terminal having a second logic level different from the first logic level, or the third clock signal applied to the third clock terminal having the second logic level and the fourth clock signal applied to the fourth clock terminal having the first logic level;

a storage device coupled to the output terminal of the first transfer gate, the storage device storing the command bit from the output terminal of the transfer gate and applying the stored command bit to an output terminal of the storage device; and a second transfer gate having an input terminal receiving the stored command bit from the output terminal of the storage device, the second transfer gate further including first, second, third, and fourth control terminals coupled to the first, second, third, and fourth clock terminals, respectively, the second transfer gate being operable to transfer the command bit to an output terminal responsive to the second and third clock terminals receiving signals having the first logic level and the first and fourth clock terminals receiving signals having the second logic level;

a control circuit having a start terminal, a clock terminal, and an output terminal, the control circuit generating a load signal responsive to a predetermined number of clock signals applied to the clock terminal after a start signal has been applied to the start terminal; and a storage register having N*M storage cells each of which has an output terminal, an input terminal coupled to the output of a respective shift register stage, and a load terminal coupled to the output terminal of the control circuit, each of the storage cells storing a signal at the output terminal of the respective shift register stage responsive to the load signal applied to the load terminal of the storage cell, the N*M storage cells collectively outputting a command word corresponding to a respective command packet.

21. The memory device of claim 20 further comprising a second storage device coupled to the output terminal of the second transfer gate, the second storage device storing the command bit from the output terminal of the second transfer gate and applying the stored command bit to an output terminal of the second storage device.

22. The memory device of claim 20 wherein the first gate comprises an AND gate.

23. The memory device of claim 20 wherein the second gate comprises an OR gate.

24. The memory device of claim 20 wherein the second transfer gate comprises first, second, third, fourth, fifth, and sixth switches connected in series with each other between first and second reference voltages, each of the switches having a control terminal, the control terminals of the third and fourth switches being coupled the output terminal of the first storage device to receive the stored command bit from the first storage device, the third switch closing responsive to a command bit of one value and the fourth switch closing responsive to a command bit of another value, a node between the second and third switches being coupled to the output terminal of the shift register stage, the control terminals of the first and second switches being coupled to the first and fourth clock terminals of the shift register and the control terminals of the fifth and sixth switches being coupled to the second and third clock terminals of the shift register, the first and second switches being operable to close to apply the first reference voltage to the third switch responsive to signals applied to the control terminals of the first and second switches having the second logic level, and the fifth and sixth switches being operable to close to apply the second reference voltage to the fourth switch responsive to signals applied to the control terminals of the fifth and sixth switches having the first logic level.

25. The memory device of claim 24 wherein the first, second and third switches each comprises a PMOS transistor, and the fourth, fifth, and sixth switches each comprises an NMOS transistor.

26. The command buffer of claim 24 wherein the first voltage comprises a supply voltage and the second reference voltage comprises ground potential.

27. A computer system, comprising:
 a processor having a processor bus;
 an input device coupled to the processor through the processor bus to allow data to be entered into the computer system;
 an output device coupled to the processor through the processor bus to allow data to be output from the computer system; and
 a memory device coupled to the processor through the processor bus, comprising:
  at least one array of memory cells storing data at a location determined by a row address and a column address responsive to a command word;
  a row address circuit to receive and decode the row address, and select a row of memory cells corresponding to the row address responsive to the command word;
  a column address circuit to receive or apply data to one of the memory cells in the selected row corresponding to the column address responsive to the command word;
  a data path circuit to couple data between an external terminal and the column address circuit responsive to a the command word; and
  a command word generator generating the word responsive to a command packet of N M-bit words received on an M-bit bus, the command word generator comprising:
   a delay circuit having an input coupled to the clock input terminal, the delay circuit being operable to generate a delayed clock signal at an output, the delay circuit delaying the input clock signal applied to its input by a phase shift corresponding to more than 0 degrees and less than 180 degrees of the input clock signal;
   a first gate operating according to an AND function, the first gate having a first input coupled to the input terminal and a second input coupled to the output of the delay circuit, the first gate generating a first clock signal;
   a first inverter having an input coupled to the output of the first gate, the first inverter generating the compliment of the first clock signal;
   a second gate operating according to an OR function; the second gate having a first input coupled to the input terminal and a second input coupled to the output of the delay circuit, the second gate generating a second clock signal;
   a second inverter having an input coupled to the output of the second gate, the second inverter generating the compliment of the second clock signal;
   M shift registers each having an input terminal, an output terminal, and first, second, third, and fourth clock terminals coupled to the output of the first gate, the output of the first inverter, the output of the second gate, and the output of the second inverter, the input of each of the shift registers being coupled to a respective bit of the M-bit bus, each of the shift registers having N stages with a respective command bit applied to the input terminal being shifted from one stage to the next responsive to the clock signals applied to the clock terminals of the shift registers, each of the shift register stages comprising;
    a first transfer gate having an input terminal to receive one of the M-bits of the command, the first transfer gate further including first, second, third, and fourth control terminals coupled to the first, second, third, and fourth clock terminals, respectively, the first transfer gate being operable to transfer the command bit to an output terminal responsive to either the first clock signal applied to the first clock terminal having a first logic level and the second clock signal applied to the second clock terminal having a second logic level different from the first logic level, or the third clock signal applied to the third clock terminal having the second logic level and the fourth clock signal applied to the fourth clock terminal having the first logic level;
    a storage device coupled to the output terminal of the first transfer gate, the storage device storing the command bit from the output terminal of the transfer gate and applying the stored command bit to an output terminal of the storage device; and
    a second transfer gate having an input terminal to receive the stored command bit from the output terminal of the storage device, the second transfer gate further including first, second, third, and fourth control terminals coupled to the first, second, third, and fourth clock terminals, respectively, the second transfer gate being operable to transfer the command bit to an output terminal responsive to the second and third clock terminals receiving signals having the first logic level and the first and fourth clock terminals receiving signals having the second logic level;
   a control circuit having a start terminal, a clock terminal, and an output terminal, the control circuit generating a load signal responsive to a predetermined number of clock signals applied to the clock terminal after a start signal has been applied to the start terminal; and
   a storage register having N*M storage cells each of which has an output terminal, an input terminal coupled to the output of a respective shift register stage, and a load terminal coupled to the output terminal of the control circuit, each of the storage cells storing a signal at the output terminal of the respective shift register stage responsive to the load signal applied to the load terminal of the storage cell, the N*M storage cells collectively outputting a command word corresponding to a respective command packet.

28. The computer system of claim 27 further comprising a second storage device coupled to the output terminal of the second transfer gate, the second storage device storing the command bit from the output terminal of the second transfer gate and applying the stored command bit to an output terminal of the second storage device.

29. The computer system of claim 27 wherein the first gate comprises an AND gate.

30. The computer system of claim 27 wherein the second gate comprises an OR gate.

31. The computer system of claim 27 wherein the second transfer gate comprises first, second, third, fourth, fifth, and sixth switches connected in series with each other between first and second reference voltages, each of the switches having a control terminal, the control terminals of the third and fourth switches being coupled the output terminal of the first storage device to receive the stored command bit from the first storage device, the third switch closing responsive to a command bit of one value and the fourth switch closing responsive to a command bit of another value, a node between the second and third switches being coupled to the output terminal of the shift register stage, the control terminals of the first and second switches being coupled to the first and fourth clock terminals of the shift register and the control terminals of the fifth and sixth switches being coupled to the second and third clock terminals of the shift register, the first and second switches being operable to close to apply the first reference voltage to the third switch responsive to signals applied to the control terminals of the first and second switches having the second logic level, and the fifth and sixth switches being operable to close to apply the second reference voltage to the fourth switch responsive to signals applied to the control terminals of the fifth and sixth switches having the first logic level.

32. The computer system of claim 31 wherein the first, second and third switches each comprises a PMOS transistor, and the fourth, fifth, and sixth switches each comprises an NMOS transistor.

33. The computer system of claim 31 wherein the first voltage comprises a supply voltage and the second reference voltage comprises ground potential.

\* \* \* \* \*

UNITED STATES PATENT AND TRADEMARK OFFICE
CERTIFICATE OF CORRECTION

PATENT : 6,029,252
DATED : February 22, 2000
INVENTOR(S) : Troy A. Manning

It is certified that error appears in the above-identified patent and that said Letters Patent is hereby corrected as shown below:

| | | |
|---|---|---|
| Column 12, Line 26 | "terminal the delay" | -- terminal, the delay -- |
| Column 14, Line 47 | "being coupled the output" | -- being coupled, the output -- |
| Column 17, Lines 37, 38 | "responsive to a the command" | -- responsive to the command -- |

Signed and Sealed this

Fifteenth Day of May, 2001

Attest:

NICHOLAS P. GODICI

Attesting Officer     Acting Director of the United States Patent and Trademark Office